United States Patent
Park et al.

(10) Patent No.: US 12,446,314 B2
(45) Date of Patent: Oct. 14, 2025

(54) DISPLAY DEVICE USING SEMICONDUCTOR LIGHT EMITTING DEVICE

(71) Applicant: LG ELECTRONICS INC., Seoul (KR)

(72) Inventors: Sungmin Park, Seoul (KR); Wonseok Choi, Seoul (KR); Soohyun Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 721 days.

(21) Appl. No.: 17/786,666

(22) PCT Filed: Jan. 8, 2020

(86) PCT No.: PCT/KR2020/000308
§ 371 (c)(1),
(2) Date: Jun. 17, 2022

(87) PCT Pub. No.: WO2021/125423
PCT Pub. Date: Jun. 24, 2021

(65) Prior Publication Data
US 2023/0023582 A1    Jan. 26, 2023

(30) Foreign Application Priority Data
Dec. 20, 2019 (KR) .................. 10-2019-0172200

(51) Int. Cl.
*H10D 86/60* (2025.01)
*H01L 25/075* (2006.01)
(Continued)

(52) U.S. Cl.
CPC .......... *H10D 86/60* (2025.01); *H01L 25/167* (2013.01); *H10D 86/441* (2025.01);
(Continued)

(58) Field of Classification Search
CPC .... H10D 86/60; H10D 86/441; H10D 86/423; H10D 30/6755; H01L 25/167;
(Continued)

(56) References Cited

U.S. PATENT DOCUMENTS

2013/0168708 A1* 7/2013 Shibata .................. H01L 24/95
257/88
2018/0012876 A1   1/2018 Kim et al.
(Continued)

FOREIGN PATENT DOCUMENTS

JP   2013-004792 A   1/2013
JP   2015-126048 A   7/2015
(Continued)

*Primary Examiner* — Herve-Louis Y Assouman
(74) *Attorney, Agent, or Firm* — Birch, Stewart, Kolasch & Birch, LLP

(57) ABSTRACT

A display device can include a base part, a semiconductor light emitting device disposed on a first region of the base part, and a plurality of assembly electrodes extending along one direction on the base part and to which a voltage is applied to dispose the semiconductor light emitting device at a pre-set position on the first region. The plurality of assembly electrodes are disposed not to overlap a thin film transistor.

17 Claims, 15 Drawing Sheets

(51) Int. Cl.
  *H01L 25/16* (2023.01)
  *H10D 30/67* (2025.01)
  *H10D 86/40* (2025.01)
  *H10H 20/825* (2025.01)
  *H10H 20/83* (2025.01)
  *H10H 20/831* (2025.01)
  *H10H 20/857* (2025.01)
  *H10H 29/14* (2025.01)
  *H10H 20/01* (2025.01)

(52) U.S. Cl.
  CPC ......... *H10H 20/831* (2025.01); *H10H 20/018* (2025.01); *H10H 20/825* (2025.01)

(58) Field of Classification Search
  CPC ....... H01L 25/0753; H01L 2224/95085; H01L 2224/95101; H01L 2224/95133; H10H 20/831; H10H 20/018; H10H 20/825; H10H 20/01; H10H 20/857; H10H 29/142; H10H 20/83
  See application file for complete search history.

(56) References Cited

U.S. PATENT DOCUMENTS

| | | | |
|---|---|---|---|
| 2018/0019369 A1* | 1/2018 | Cho | H05K 1/181 |
| 2018/0122298 A1* | 5/2018 | Lee | H01L 25/167 |
| 2018/0315775 A1 | 11/2018 | He et al. | |
| 2019/0114958 A1 | 4/2019 | Shin et al. | |
| 2019/0326348 A1 | 10/2019 | Im et al. | |
| 2022/0278260 A1 | 9/2022 | Chang et al. | |
| 2022/0367757 A1 | 11/2022 | Moon et al. | |
| 2022/0415859 A1 | 12/2022 | Choi et al. | |

FOREIGN PATENT DOCUMENTS

| | | |
|---|---|---|
| KR | 10-2019-0075869 A | 7/2019 |
| KR | 10-2019-0085892 A | 7/2019 |
| KR | 10-2019-0099149 A | 8/2019 |
| KR | 10-2019-0106885 A | 9/2019 |
| KR | 10-2019-0118992 A | 10/2019 |
| KR | 19-2019-0121884 A | 10/2019 |

* cited by examiner

[Figure 1]
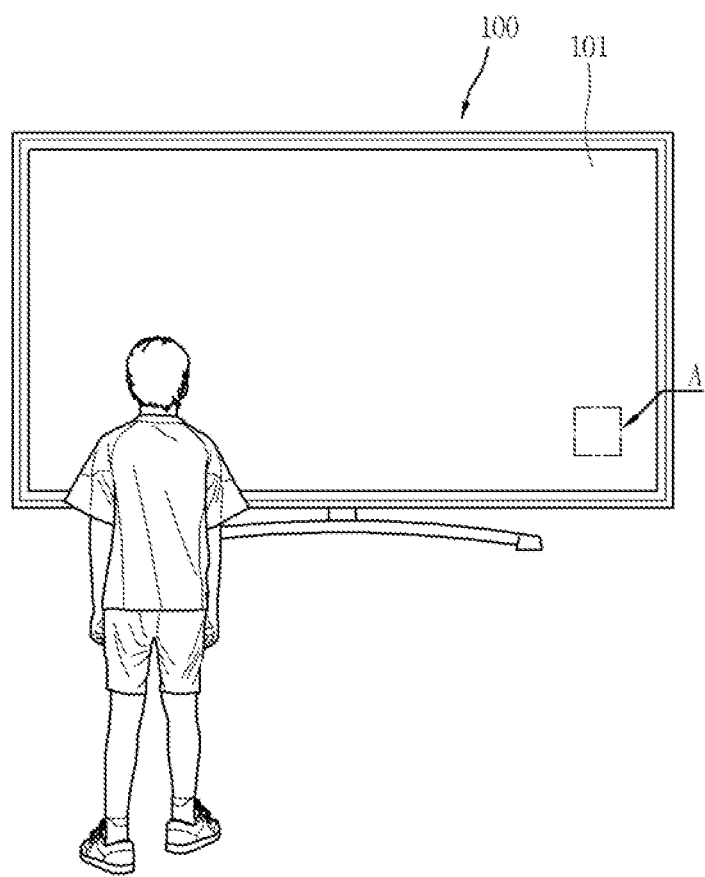

[Figure 2]
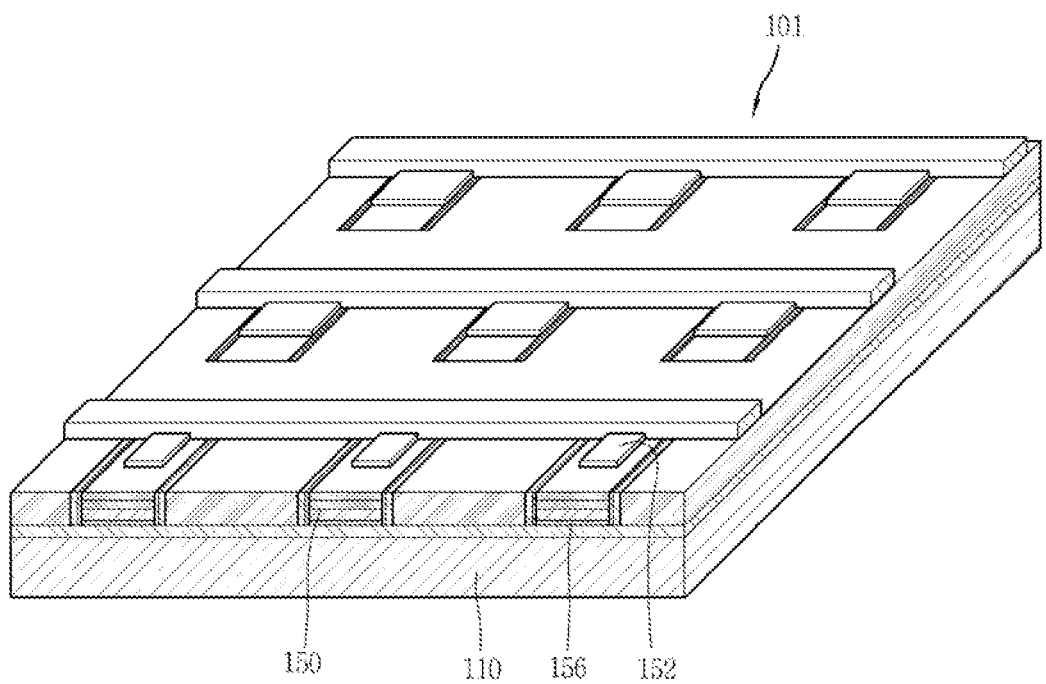
[Figure 3]
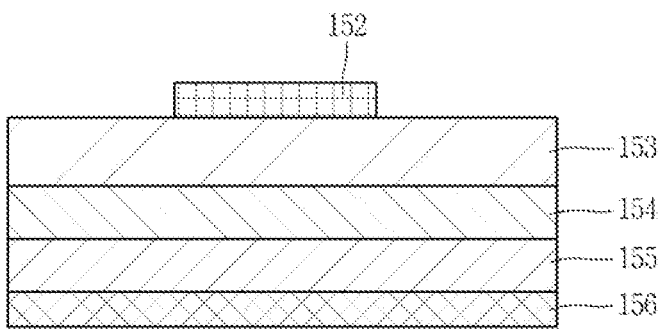

[Figure 4]
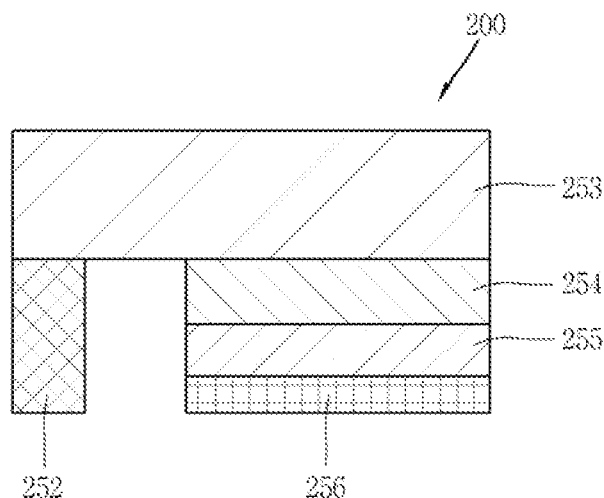
[Figure 5a]
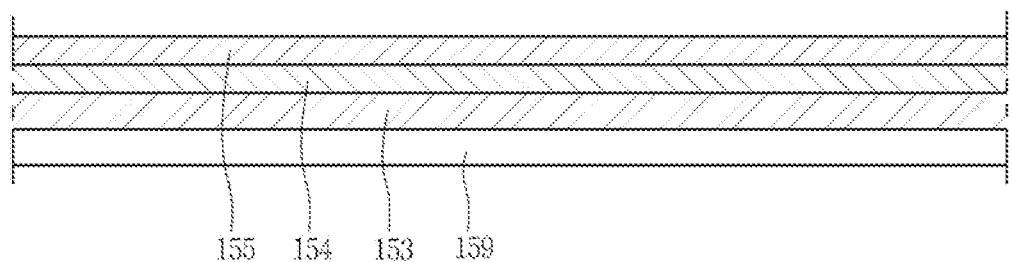
[Figure 5b]
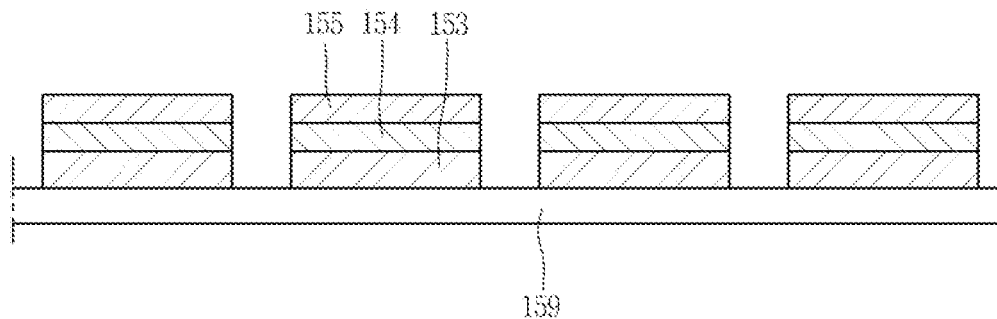

[Figure 5c]
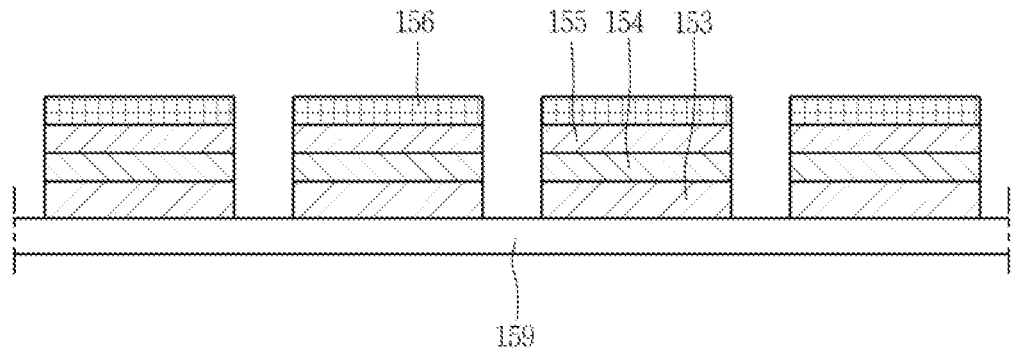
[Figure 5d]
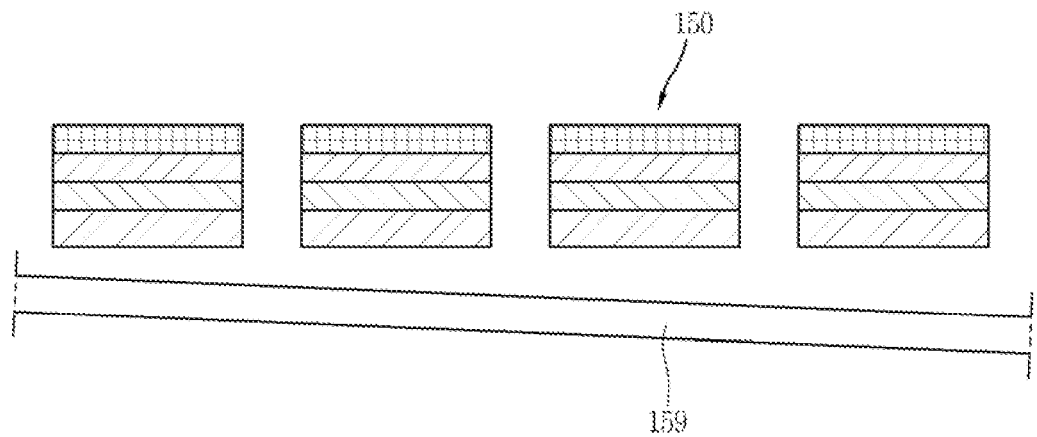
[Figure 5e]
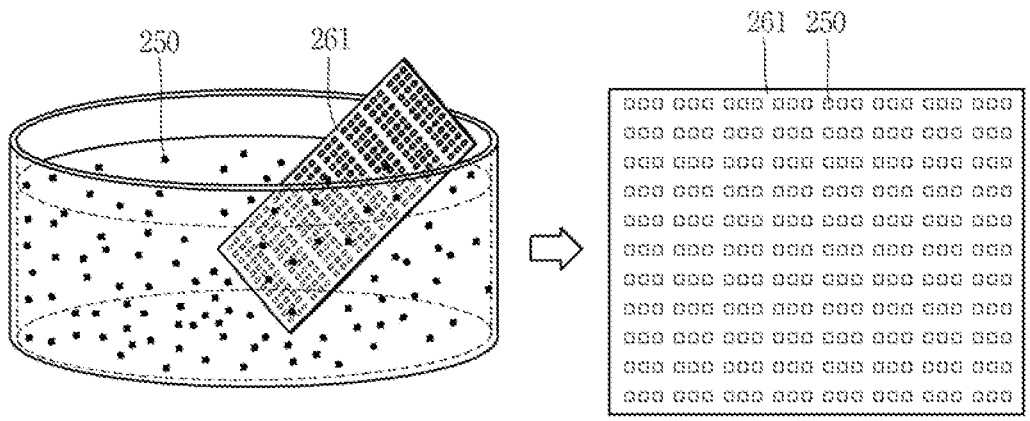

[Figure 6]
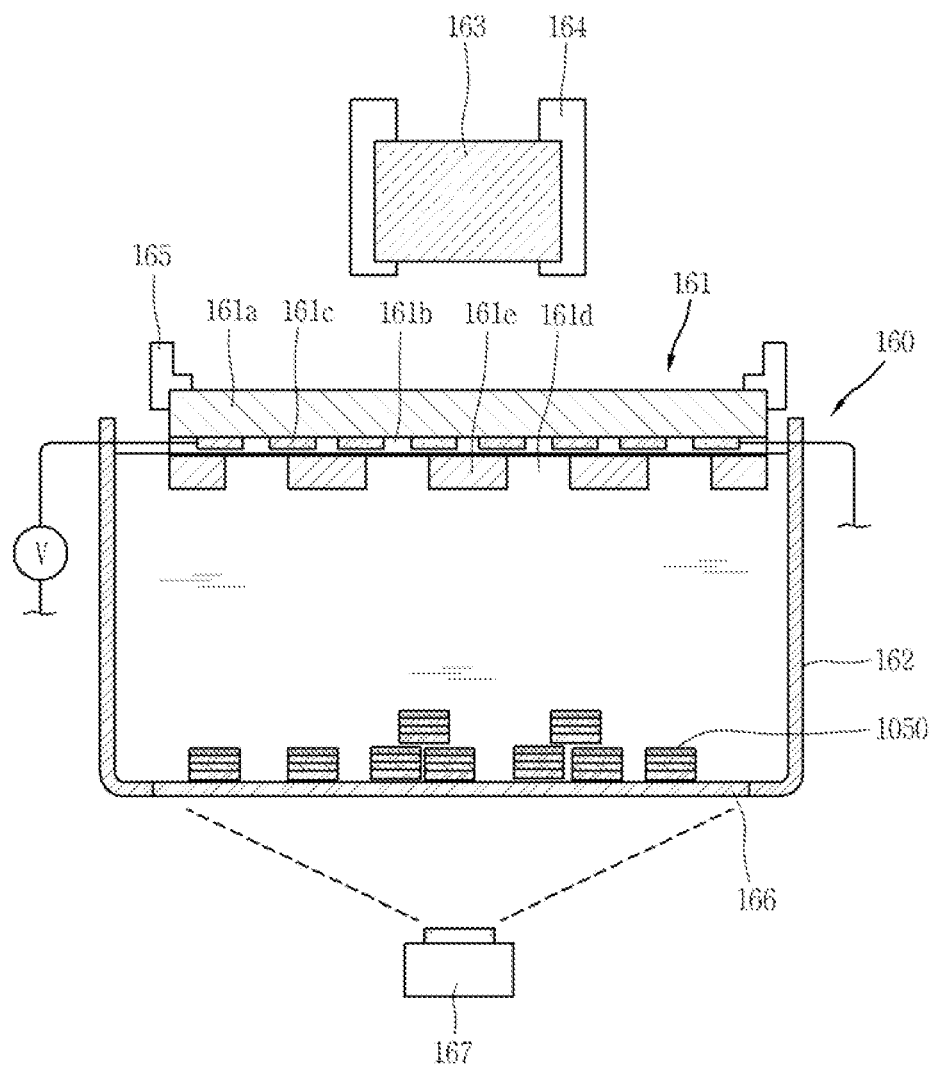

[Figure 7]
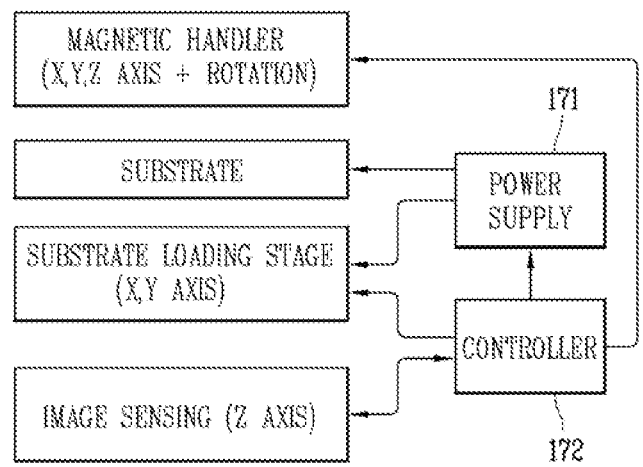
[Figure 8a]
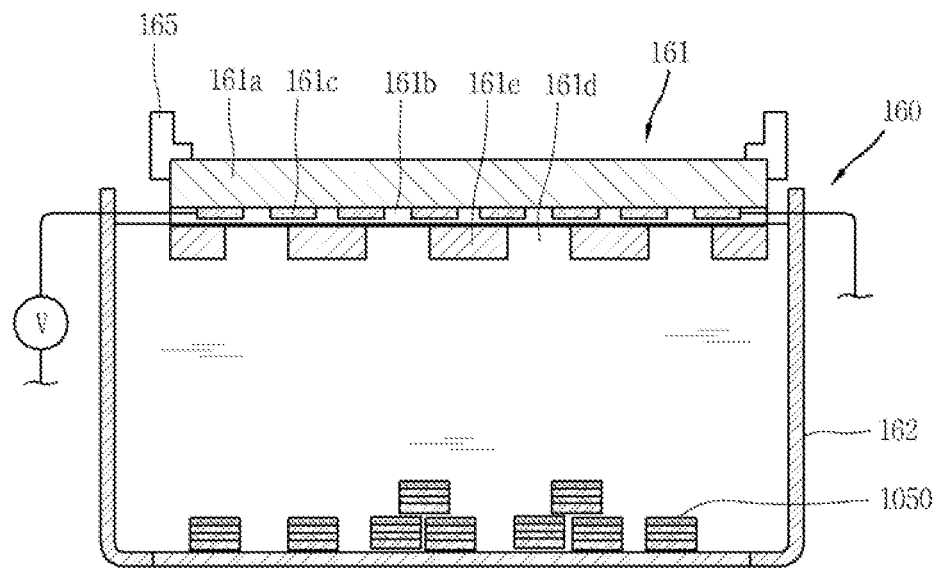

[Figure 8b]
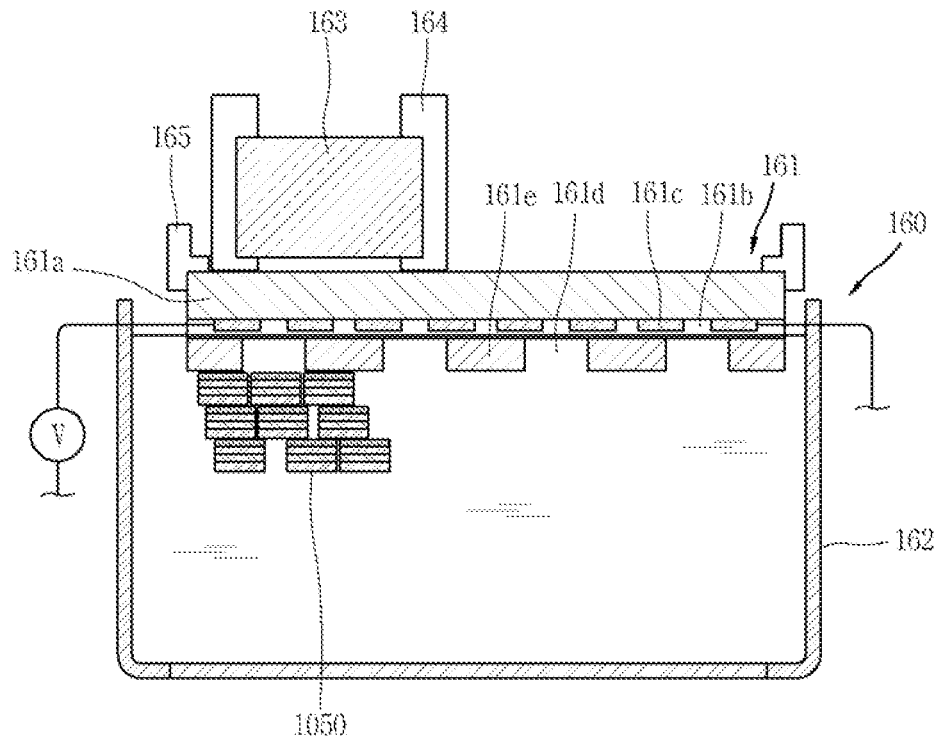
[Figure 8c]
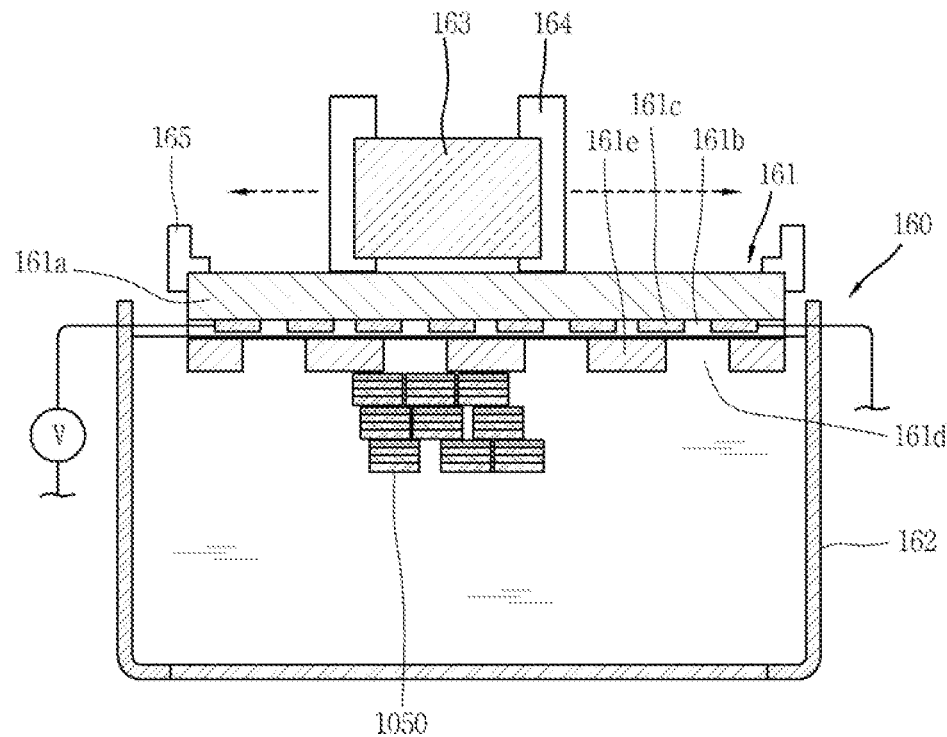

[Figure 8d]
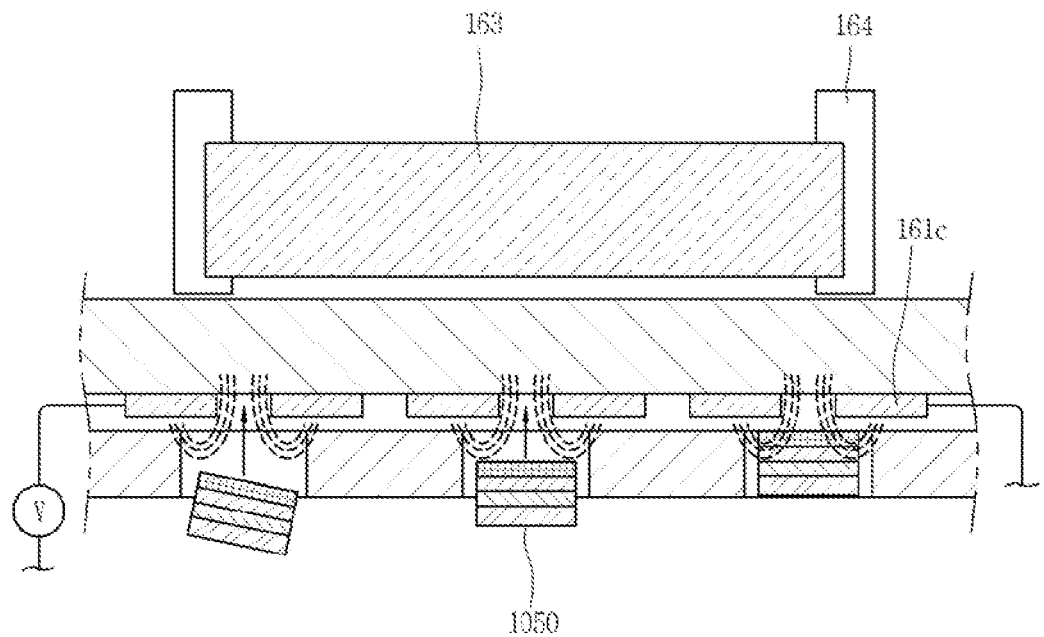
[Figure 8e]
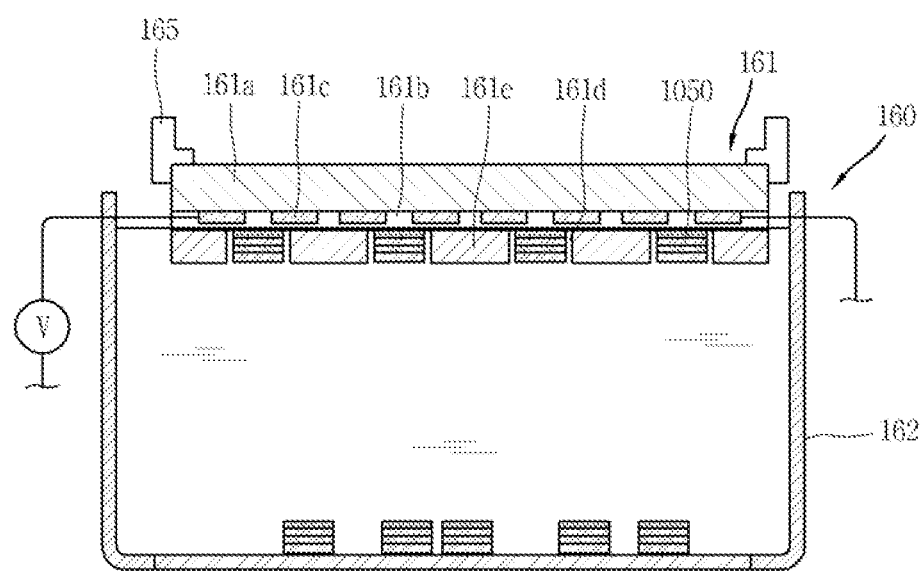

[Figure 9]
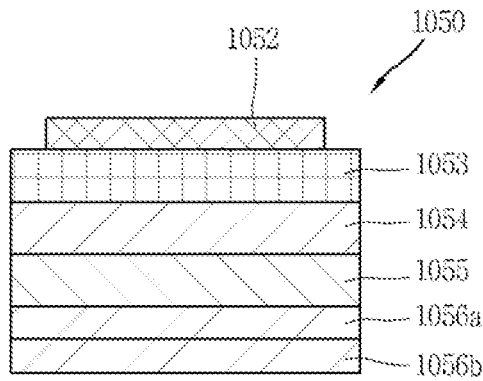
[Figure 10]
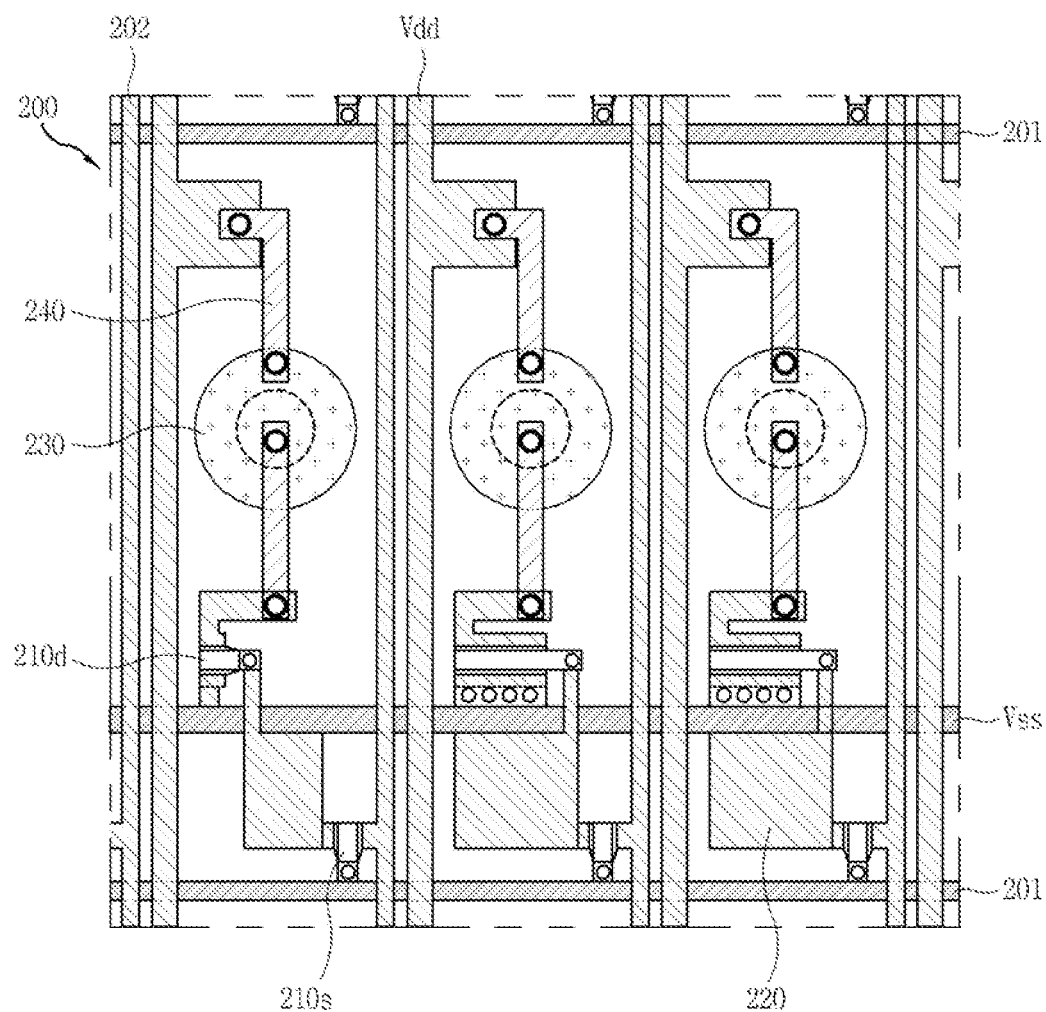

[Figure 11]
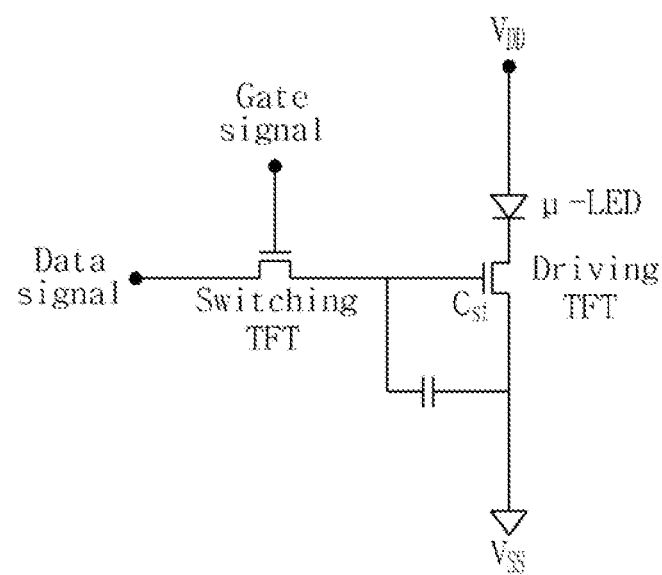

[Figure 12]
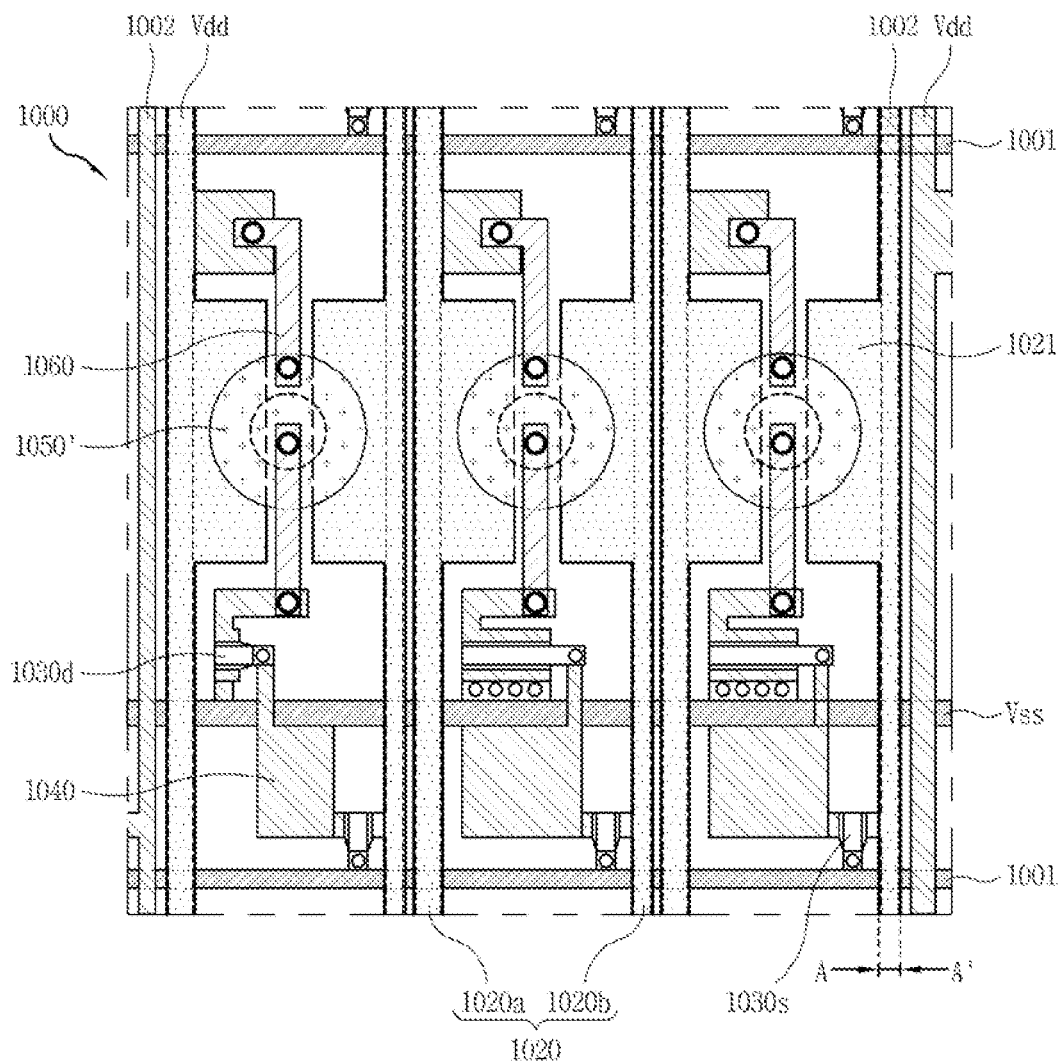

[Figure 13]
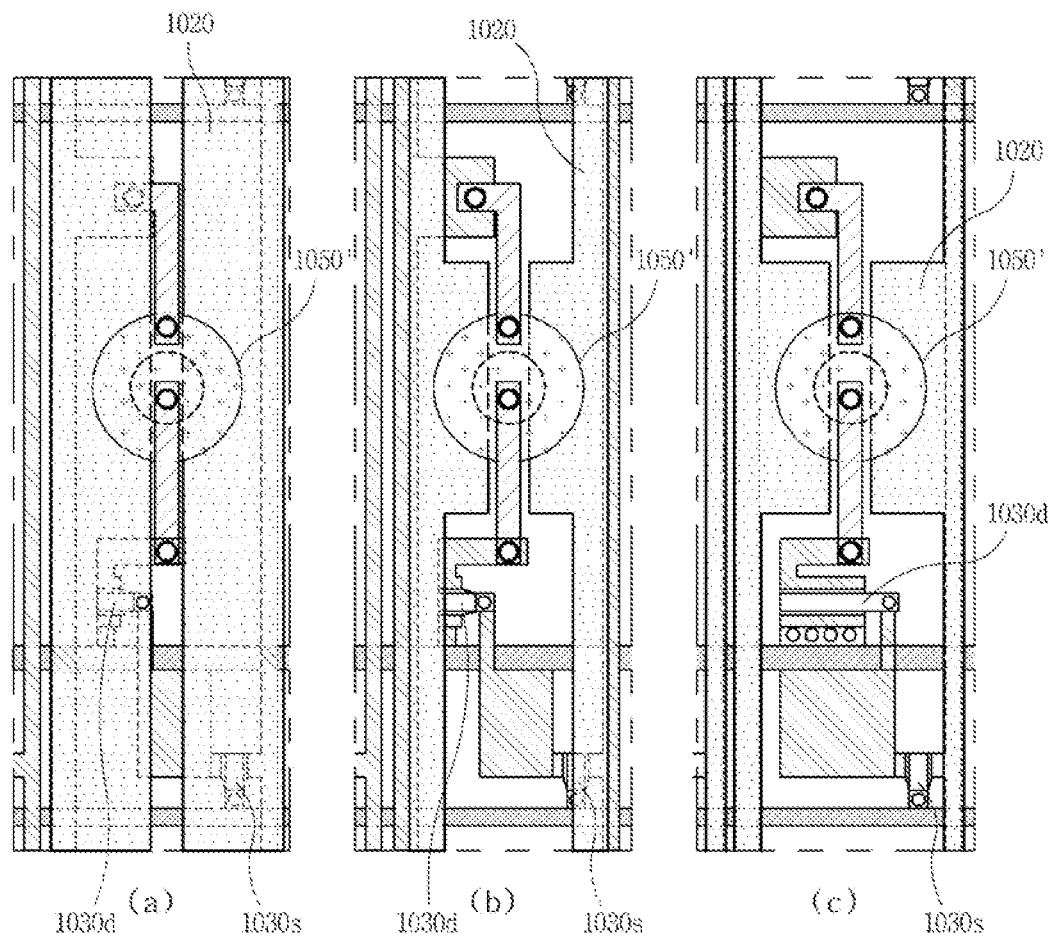

[Figure 14]
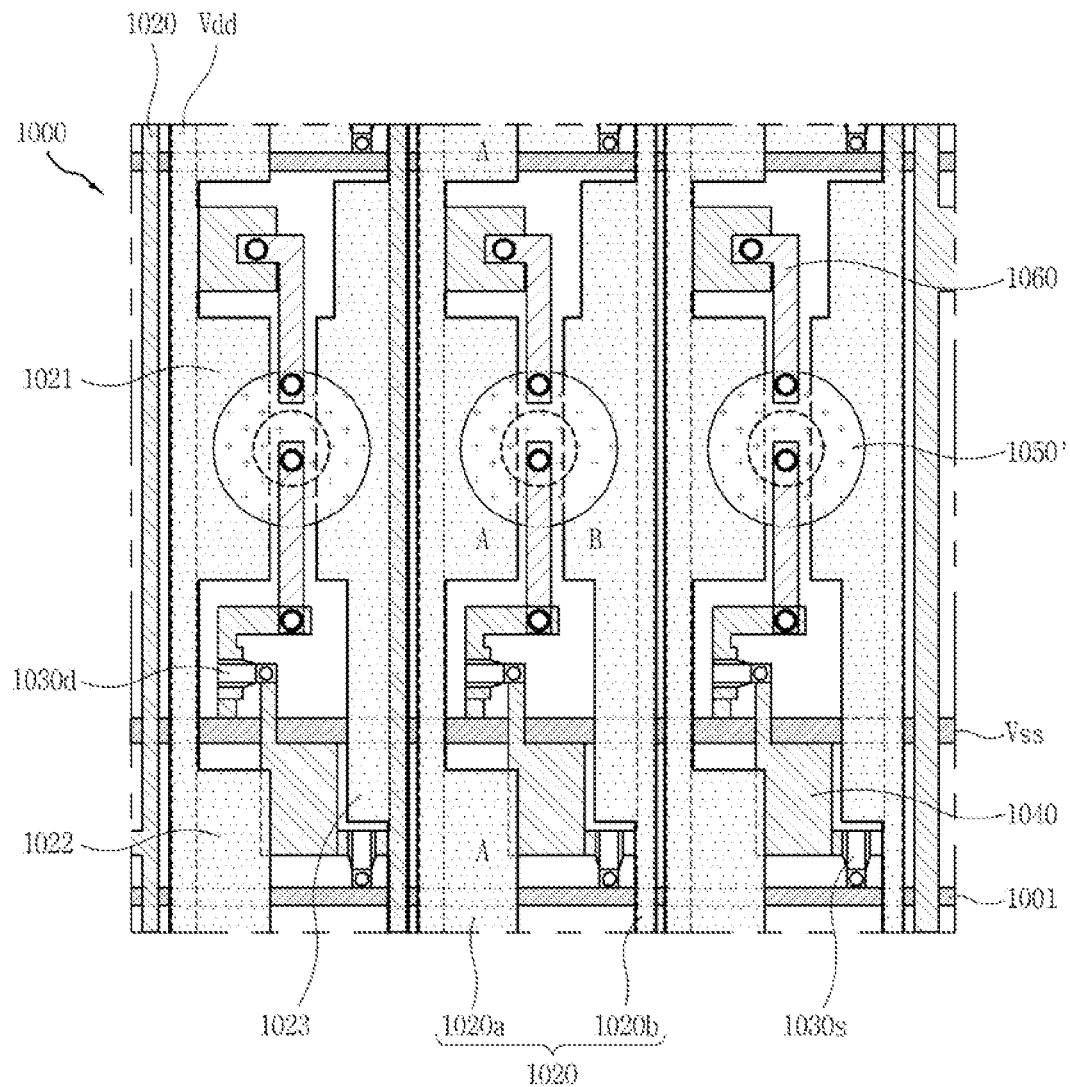

[Figure 15]
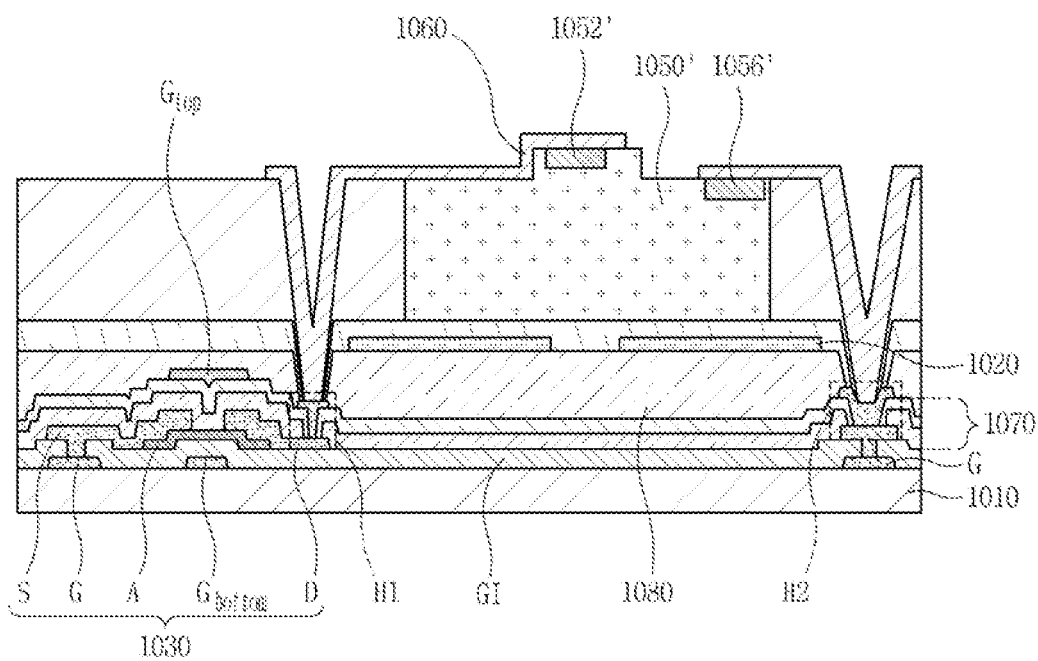

[Figure 16]
(a)
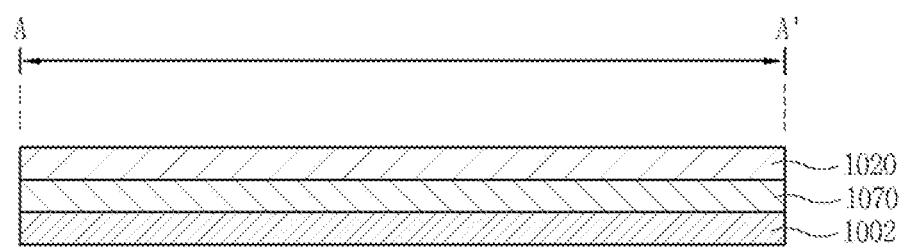
(b)
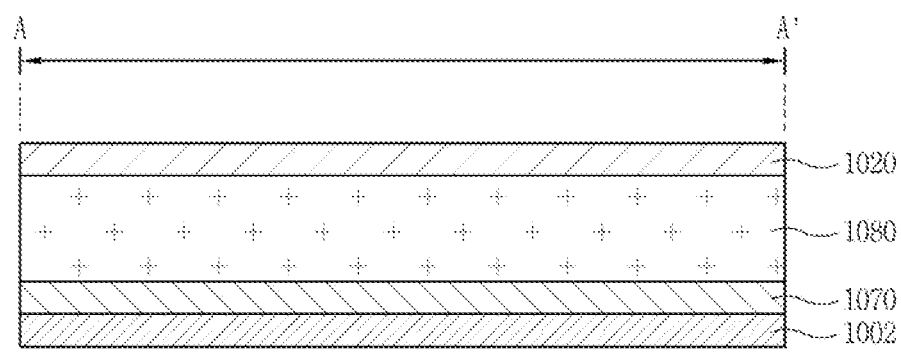

DISPLAY DEVICE USING SEMICONDUCTOR LIGHT EMITTING DEVICE

CROSS REFERENCE TO RELATED APPLICATIONS

This application is the National Stage filing under 35 U.S.C. 371 of International Application No. PCT/KR2020/000308, filed on Jan. 8, 2020, which claims the benefit of earlier filing date and right of priority to Korean Application No. 10-2019-0172200, filed on Dec. 20, 2019, the entire contents of all these applications are hereby expressly incorporated by reference into the present application.

TECHNICAL FIELD

The present invention relates to a display device using a semiconductor light emitting device, and more particularly, to a display device using a semiconductor light emitting device having a size of several to several tens of µm.

BACKGROUND ART

Recently, liquid crystal displays (LCD), organic light emitting device (OLED) displays, and micro LED displays are competing to implement large-area displays in the display technology field.

However, in the case of LCD, there are problems such as not fast response time and low efficiency of light generated by the backlight.

In the case of OLED, a short lifespan, poor mass production yield, and low efficiency exist.

On the other hand, when a semiconductor light emitting device (micro LED) having a diameter or cross-sectional area of 100 µm or less is used for a display, very high efficiency can be provided because the display does not absorb light using a polarizing plate or the like. However, since a large display requires millions of semiconductor light emitting devices, it is difficult to transfer the devices compared to other technologies.

Technologies that are currently being developed as a transfer process include pick & place, Laser Lift-off (LLO), or self-assembly. Among them, the self-assembly method is a method in which the semiconductor light emitting device finds its own position in a fluid, and is the most advantageous method for realizing a large screen display device.

The self-assembly method are a method of directly assembling the semiconductor light emitting device on the final substrate to be used in the product, and a method of assembling the semiconductor light emitting device on the assembly substrate and transferring the semiconductor light emitting device to the final substrate through an additional transfer process. The method of direct assembly to the final substrate is efficient in terms of process, and when using the assembly substrate, there is an advantage in that structures for self-assembly can be added without limitation, so the two methods are selectively used.

DISCLOSURE

Technical Problem

An object of the present invention is to provide an active matrix type display device having a structure for self-assembly added.

In particular, an object of the present invention is to provide a display device including an assembly electrode having a structure capable of securing an assembly rate of a certain level or higher without damaging the thin film transistor.

Technical Solution

The display device of the present invention can include a base part; a semiconductor light emitting device disposed on the first region of the base part; a thin film transistor disposed on a second region of the base part; and assembly electrodes extending along one direction on the base part and to which a voltage is applied to settle the semiconductor light emitting device at a pre-set position on the first region. And the assembly electrodes can be formed not to overlap the thin film transistor.

According to an embodiment of the present invention, the assembly electrodes can further include a first protrusion protruding toward the semiconductor light emitting device in the first region, and the first protrusion can overlap the semiconductor light emitting device.

According to an embodiment of the present invention, the assembly electrodes can further include at least one of a second protrusion protruding toward the second region and a third protrusion protruding toward the first region and the second region.

According to an embodiment of the present invention, a pair of electrodes can be formed between the adjacent assembly electrodes, and each of the assembly electrodes forming the pair of electrodes has a different shape.

According to an embodiment of the present invention, a pair electrode can be formed between the adjacent assembly electrodes, and areas A and B of the protrusions of each of the assembly electrodes forming the pair electrode satisfy Formula 1 below.

$$|A-B|/A \leq 0.1 \text{ and } |A-B|/B \leq 0.1 \qquad \text{[Equation 1]}$$

According to an embodiment of the present invention, the thin film transistor can be an oxide thin film transistor.

According to an embodiment of the present invention, the base part can include a plurality of gate lines and data lines formed to cross each other and connected to the thin film transistor, and the data lines can extend in the same direction as the assembly electrodes.

According to an embodiment of the present invention, the thin film transistor can include a gate electrode; an active layer insulated from the gate electrode by an insulating layer and overlapping a portion of the gate electrode; and a source electrode and a drain electrode formed on both sides of the active layer.

According to an embodiment of the present invention, the embodiment can include a first passivation layer formed on the insulating layer while forming a hole exposing a portion of the source electrode and the drain electrode.

According to an embodiment of the present invention, the embodiment can include a connection electrode extending from the first region to the second region to electrically connect the thin film transistor and the semiconductor light emitting device to cover the hole and the electrode of the semiconductor light emitting device.

An embodiment of the present invention can further include a second passivation layer formed on at least an area overlapping with the data line and the assembly electrode among the entire area of the first passivation layer.

According to an embodiment of the present invention, the second passivation layer can be formed of an organic material and has a thickness greater than that of the first passivation layer.

Advantageous Effects

According to an embodiment of the present invention, there is an effect that semiconductor light emitting devices can be directly assembled on a display substrate including a thin film transistor through a self-assembly method.

In particular, by forming the assembly electrode not to overlap the thin film transistor, it is possible to prevent a deterioration and a performance degradation of the thin film transistor due to self-assembly.

In addition, by manufacturing various shapes of the assembly electrode under the condition that it does not overlap with the thin film transistor, there is an effect of preventing an increase in the resistance of the assembly electrode and securing an assembly rate of a certain level or more.

DESCRIPTION OF DRAWINGS

FIG. 1 is a conceptual diagram showing an embodiment of a display device using a semiconductor light emitting device of the present invention.

FIG. 2 is a partially enlarged view of a portion A of the display device of FIG. 1.

FIG. 3 is an enlarged view of the semiconductor light emitting device of FIG. 2.

FIG. 4 is an enlarged view showing another embodiment of the semiconductor light emitting device of FIG. 2.

FIGS. 5A to 5E are conceptual views for explaining a new process of manufacturing the above-described semiconductor light emitting device.

FIG. 6 is a conceptual diagram illustrating an example of an apparatus for self-assembly of a semiconductor light emitting device according to the present invention.

FIG. 7 is a block diagram of the self-assembly apparatus of FIG. 6.

FIGS. 8A to 8E are conceptual views illustrating a process of self-assembling a semiconductor light emitting device using the self-assembly apparatus of FIG. 6.

FIG. 9 is a conceptual diagram illustrating the semiconductor light emitting device of FIGS. 8A to 8E.

FIGS. 10 and 11 are conceptual diagrams illustrating the structure and circuit of a pixel portion in a conventional AM display device.

FIG. 12 is a diagram illustrating a structure of a pixel portion in an AM display device according to an embodiment of the present invention.

FIGS. 13 (a) to (c) are views showing the shapes of various assembly electrodes for performance comparison of thin film transistors.

FIG. 14 is a diagram illustrating a structure of a pixel portion in an AM display device according to another embodiment of the present invention.

FIG. 15 is a diagram illustrating a side cross-section of a pixel portion in an AM display device according to an embodiment of the present invention.

FIGS. 16A and 16B are side cross-sectional views of an area (AA' in FIG. 12) in which data wires and assembly electrodes are formed in an AM display device according to an embodiment of the present invention.

MODE FOR INVENTION

Hereinafter, the embodiments disclosed in the present specification will be described in detail with reference to the attached drawings, but the same or similar components are given the same reference sign regardless of the reference numerals, and the redundant description thereof will be omitted. The suffixes "module" and "part" for components used in the following description are given or mixed in consideration of only the ease of writing the specification, and do not have a meaning or role distinct from each other by themselves. Also, in describing the embodiments disclosed in the present specification, if it is determined that detailed descriptions of related known technologies may obscure the meaning of the embodiments disclosed in the present specification, the detailed description thereof will be omitted. In addition, the attached drawings are only for easy understanding of the embodiments disclosed in the present specification, and should not be construed as limiting the technical idea disclosed herein by the attached drawings. Also, when an element such as a layer, region or substrate is referred to as being "on" another component, it will be understood that this may be directly on other elements or intervening elements may exist in between.

A display device described in this specification can include a mobile phone, a smart phone, a laptop computer, a digital broadcasting terminal, a PDA (personal digital assistant), a PMP (portable multimedia player), a navigation, a slate PC, a tablet PC (tablet PC), a ultra book, a digital TV, a desktop computer, etc. However, the configuration according to the embodiment described in this specification can be applied as long as it can include a display even in a new product form to be developed later.

FIG. 1 is a conceptual diagram showing an embodiment of a display device using a semiconductor light emitting device of the present invention, FIG. 2 is a partial enlarged view of part A of the display device of FIG. 1, FIG. 3 is an enlarged view of the semiconductor light emitting device of FIG. 2, and FIG. 4 is an enlarged view illustrating another embodiment of the semiconductor light emitting device of FIG. 2.

As illustrated, information processed by the control unit of the display device 100 can be output from the display module 140. A closed-loop case 101 surrounding an edge of the display module can form a bezel of the display device.

The display module 140 can include a panel 141 on which an image is displayed, the panel 141 can include a micro-sized semiconductor light emitting device 150 and a wiring substrate 110 on which the semiconductor light emitting device 150 is mounted.

A wiring can be formed on the wiring substrate 110 to be connected to the n-type electrode 152 and the p-type electrode 156 of the semiconductor light emitting device 150. Through this, the semiconductor light emitting device 150 can be provided on the wiring substrate 110 as an individual pixel that emits light.

The image displayed on the panel 141 is visual information, and is implemented by independently controlling the light emission of sub-pixels arranged in a matrix form through the wiring.

In the present invention, a micro LED (Light Emitting Diode) is exemplified as a type of the semiconductor light emitting device 150 that converts current into light. The micro LED can be a light emitting diode formed in a small size of 100 micrometers or less. In the semiconductor light emitting device 150, blue, red, and green colors are respectively provided in the light emitting region, and a unit pixel can be implemented by a combination thereof. That is, the unit pixel means a minimum unit for implementing one color, and at least three micro LEDs can be provided in the unit pixel.

More specifically, referring to FIG. 3, the semiconductor light emitting device 150 can have a vertical structure.

For example, the semiconductor light-emitting device 150 can be implemented as a high-output light-emitting device that emits various types of light, including blue, by mainly using gallium nitride (GaN) and adding indium (In) and/or aluminum (Al) together.

Such a vertical semiconductor light emitting device includes a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the lower p-type electrode 156 can be electrically connected to the p-electrode of the wiring substrate, and the upper n-type electrode 152 can be electrically connected to the n-electrode at the upper side of the semiconductor light emitting device. The vertical semiconductor light emitting device 150 has a great advantage in that it is possible to reduce the chip size because electrodes can be arranged up and down.

As another example, referring to FIG. 4, the semiconductor light emitting device can be a flip chip type light emitting device.

As an example, the semiconductor light emitting device 250 includes a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 can be electrically connected to the p-electrode and the n-electrode of the wiring substrate under the semiconductor light emitting device.

The vertical semiconductor light emitting device and the horizontal semiconductor light emitting device can be a green semiconductor light emitting device, a blue semiconductor light emitting device, or a red semiconductor light emitting device, respectively. In the case of a green semiconductor light emitting device and a blue semiconductor light emitting device, gallium nitride (GaN) is mainly used, and indium (In) and/or aluminum (Al) are added together, so that it can be implemented as a high-output light emitting device emitting green or blue light. For this example, the semiconductor light emitting device can be a gallium nitride thin film formed in various layers such as n-Gan, p-Gan, AlGaN, InGan, etc. Specifically, the p-type semiconductor layer can be P-type GaN, and the n-type semiconductor layer can be N-type GaN. However, in the case of a red semiconductor light emitting device, the p-type semiconductor layer can be P-type GaAs, and the n-type semiconductor layer can be N-type GaAs.

Also, the p-type semiconductor layer can be P-type GaN doped with Mg on the p-electrode side, and the n-type semiconductor layer can be N-type GaN doped with Si on the n-electrode side. In this case, the above-described semiconductor light emitting devices can be semiconductor light emitting devices without an active layer.

On the other hand, referring to FIGS. 1 to 4, since the light emitting diode is very small, in the display panel, self-luminous unit pixels can be arranged in a high definition, through this, a high-definition display device can be implemented.

In the display device using the semiconductor light emitting device of the present invention described above, the semiconductor light emitting device grown on a wafer and formed through mesa and isolation is used as an individual pixel. In this case, the micro-sized semiconductor light emitting device 150 should be transferred to a pre-set position on the substrate of the display panel on the wafer. There is a pick and place method as such a transfer technology, but the success rate is low and a lot of time is required. As another example, there is a technique of transferring several devices at once using a stamp or a roll, but there is a limit to the yield, which is not suitable for a large screen display. The present invention proposes a new manufacturing method and manufacturing device of a display device that can solve these problems.

To this end, hereinafter, a new method of manufacturing a display device will be described. FIGS. 5A to 5E are conceptual views for explaining a new process of manufacturing the above-described semiconductor light emitting device.

In this specification, a display device using a passive matrix (PM) type semiconductor light emitting device is exemplified. However, the examples described below are also applicable to an active matrix (AM) type semiconductor light emitting device. In addition, although a method of self-assembly a horizontal semiconductor light emitting device is exemplified, it is also applicable to a method of self-assembly a vertical semiconductor light emitting device.

First, according to the manufacturing method, the first conductivity type semiconductor layer 153, the active layer 154, and the second conductivity type semiconductor layer 155 are grown on the growth substrate 159, respectively (refer to FIG. 5A).

When the first conductivity type semiconductor layer 153 is grown, next, an active layer 154 is grown on the first conductivity type semiconductor layer 153, next, a second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5A, the first conductivity type semiconductor layer 153, the active layer 154, and the second conductivity type semiconductor layer 155 form a stacked structure.

In this case, the first conductivity type semiconductor layer 153 can be a p-type semiconductor layer, and the second conductivity type semiconductor layer 155 can be an n-type semiconductor layer. However, the present invention is not necessarily limited thereto, and examples in which the first conductivity type is n-type and the second conductivity type is p-type are also possible.

In addition, although the case in which the active layer is present is exemplified in this embodiment, a structure without the active layer is possible in some cases as described above. For this example, the p-type semiconductor layer can be P-type GaN doped with Mg, and the n-type semiconductor layer can be N-type GaN doped with Si on the n-electrode side.

The growth substrate 159 (wafer) can be formed of a material having a light-transmitting property, for example, any one of sapphire (Al2O3), GaN, ZnO, and AlO, but is not limited thereto. In addition, the growth substrate 159 can be formed of a material suitable for semiconductor material growth, a carrier wafer. Also, it can be formed of a material with excellent thermal conductivity, including a conductive substrate or an insulating substrate, for example, at least one of Si, GaAs, GaP, InP, Ga2O3 or a SiC substrate having higher thermal conductivity than a sapphire (Al2O3) substrate can be used.

Next, at least some of the first conductivity type semiconductor layer 153, the active layer 154, and the second conductivity type semiconductor layer 155 are removed to form a plurality of semiconductor light emitting devices (refer to FIG. 5B).

More specifically, isolation is performed so that a plurality of light emitting devices form a light emitting device array. That is, the first conductivity type semiconductor layer 153, the active layer 154, and the second conductivity type semiconductor layer 155 are vertically etched to form a plurality of semiconductor light emitting devices.

If a horizontal semiconductor light emitting device is formed, the active layer 154 and the second conductivity type semiconductor layer 155 are partially removed in the vertical direction, a mesa process in which the first conductivity type semiconductor layer 153 is exposed to the outside, and an isolation process in which the first conductivity type semiconductor layer is etched to form a plurality of semiconductor light emitting device arrays can be performed thereafter.

Next, second conductive electrodes 156 (or p-type electrodes) are respectively formed on one surface of the second conductivity type semiconductor layer 155 (refer to FIG. 5C). The second conductive electrode 156 can be formed by a deposition method such as sputtering, but the present invention is not limited thereto. However, when the first conductivity type semiconductor layer and the second conductivity type semiconductor layer are an n-type semiconductor layer and a p-type semiconductor layer, respectively, the second conductive electrode 156 can be an n-type electrode.

Next, the growth substrate 159 is removed to provide a plurality of semiconductor light emitting devices. For example, the growth substrate 159 can be removed using a laser lift-off (LLO) method or a chemical lift-off (CLO) method (refer to FIG. 5D).

Thereafter, a step of settling the semiconductor light emitting devices 150 on a substrate in a chamber filled with a fluid is performed (refer to FIG. 5E).

For example, the semiconductor light emitting devices 150 and the substrate are put in a chamber filled with a fluid, and the semiconductor light emitting devices are self-assembled on the substrate 1061 using flow, gravity, surface tension, and the like. In this case, the substrate can be the assembly substrate 161.

As another example, it is also possible to put a wiring substrate in a fluid chamber instead of the assembly substrate 161 so that the semiconductor light emitting devices 150 are directly disposed on the wiring substrate. In this case, the substrate can be a wiring substrate. However, for convenience of description, in the present invention, the substrate is provided as the assembly substrate 161 to exemplify that the semiconductor light emitting devices 1050 are mounted.

Cells (not shown) in which the semiconductor light emitting devices 150 are inserted can be provided in the assembly substrate 161 to facilitate mounting of the semiconductor light emitting devices 150 on the assembly substrate 161. Specifically, cells in which the semiconductor light emitting devices 150 are disposed are formed on the assembly substrate 161 at positions where the semiconductor light emitting devices 150 are aligned with the wiring electrodes. The semiconductor light emitting devices 150 are assembled to the cells while moving in the fluid.

After arranging a plurality of semiconductor light emitting devices on the assembly substrate 161, if the semiconductor light emitting devices of the assembly substrate 161 are transferred to a wiring substrate, large-area transfer is possible. Accordingly, the assembly substrate 161 can be referred to as a temporary substrate.

On the other hand, in order to apply the self-assembly method described above to the manufacture of a large-screen display, it is necessary to increase the transfer yield. The present invention proposes a method and device for minimizing the influence of gravity or frictional force and preventing non-specific binding in order to increase the transfer yield.

In this case, in the display device according to the present invention, a magnetic material is disposed on a semiconductor light emitting device to move the semiconductor light emitting device using magnetic force, and the semiconductor light emitting device is disposed at a pre-set position by using an electric field during the movement process. Hereinafter, such a transfer method and device will be described in more detail with the attached drawings.

FIG. 6 is a conceptual diagram illustrating an example of a self-assembly device for a semiconductor light emitting device according to the present invention, and FIG. 7 is a block diagram of the self-assembly device of FIG. 6. FIGS. 8A to 8D are conceptual views illustrating a process of self-assembly a semiconductor light emitting device using the self-assembly device of FIG. 6, and FIG. 9 is a conceptual diagram for explaining the semiconductor light emitting device of FIGS. 8A to 8D.

Referring to FIGS. 6 and 7, the self-assembly device 160 of the present invention can include a fluid chamber 162, a magnet 163, and a position control unit 164.

The fluid chamber 162 has a space for accommodating a plurality of semiconductor light emitting devices. The space can be filled with a fluid, and the fluid can include water as an assembly solution. Accordingly, the fluid chamber 162 can be a water tank and can be configured as an open type. However, the present invention is not limited thereto, and the fluid chamber 162 can be of a closed type in which the space is a closed space.

In the fluid chamber 162, the substrate 161 can be disposed such that an assembly surface on which the semiconductor light emitting devices 150 are assembled faces downward. For example, the substrate 161 can be transferred to an assembly position by a transfer unit, and the transfer unit can include a stage 165 on which the substrate is mounted. The position of the stage 165 is adjusted by the controller, and through this, the substrate 161 can be transferred to the assembly position.

At this time, the assembly surface of the substrate 161 faces the bottom of the fluid chamber 150 in the assembly position. As shown, the assembly surface of the substrate 161 is arranged to be immersed in the fluid in the fluid chamber 162. Accordingly, the semiconductor light emitting device 150 moves to the assembly surface in the fluid.

The substrate 161 is an assembly substrate capable of forming the electric field, and can include a base part 161a, a dielectric layer 161b, and a plurality of electrodes 161c.

The base part 161a can be made of an insulating material, and the plurality of electrodes 161c can be thin film or thick film bi-planar electrodes patterned on one surface of the base part 161a. The electrode 161c can be formed of, for example, a stack of Ti/Cu/Ti, Ag paste, ITO, or the like.

The dielectric layer 161b can be made of an inorganic material such as SiO2, SiNx, SiON, Al2O3, TiO2, HfO2, or the like. Alternatively, the dielectric layer 161b can be formed of a single layer or a multi-layer as an organic insulator. The thickness of the dielectric layer 161b can be in the range of several tens of nm to several µm.

Furthermore, the substrate 161 according to the present invention includes a plurality of cells 161d partitioned by barrier wall. The cells 161d are sequentially arranged in one direction and can be made of a polymer material. Also, the barrier wall 161e forming the cells 161d are shared with the neighboring cells 161d. The barrier wall 161e protrudes from the base part 161a, and the cells 161d can be sequentially disposed along one direction by the barrier wall 161e. More specifically, the cells 161d can be sequentially arranged in the column and row directions, respectively, and can have a matrix structure.

Inside the cells 161d, as shown, a groove for accommodating the semiconductor light emitting device 150 is provided, and the groove can be a space defined by the barrier wall 161e. The shape of the groove can be the same as or similar to that of the semiconductor light emitting device. For example, when the semiconductor light emitting device has a rectangular shape, the groove can have a rectangular shape. Also, although not shown, when the semiconductor light emitting device has a circular shape, the grooves formed in the cells can have a circular shape. Furthermore, each of the cells is configured to accommodate a single semiconductor light emitting device. That is, one semiconductor light emitting device is accommodated in one cell.

Meanwhile, the plurality of electrodes 161c can include a plurality of electrode lines disposed at the bottom of each of the cells 161d, and the plurality of electrode lines can extend to adjacent cells.

The plurality of electrodes 161c are disposed below the cells 161d, and different polarities are applied to each other to generate an electric field in the cells 161d. To form the electric field, the dielectric layer can form the bottom of the cells 161d while covering the plurality of electrodes 161c with the dielectric layer. In this structure, when different polarities are applied to the pair of electrodes 161c under each of the cells 161d, an electric field can be formed, and the semiconductor light emitting device can be inserted into the cells 161d by the electric field.

In the assembly position, the electrodes of the substrate 161 are electrically connected to the power supply unit 171. The power supply unit 171 applies power to the plurality of electrodes to generate the electric field.

As shown, the self-assembly device can include a magnet 163 for applying a magnetic force to the semiconductor light emitting devices. The magnet 163 is spaced apart from the fluid chamber 162 to apply a magnetic force to the semiconductor light emitting devices 150. The magnet 163 can be disposed to face the opposite surface of the assembly surface of the substrate 161, and the position of the magnet is controlled by the position controller 164 connected to the magnet 163.

The semiconductor light emitting device 1050 can include a magnetic material to move in the fluid by the magnetic field of the magnet 163.

Referring to FIG. 9, in a semiconductor light emitting device including a magnetic material can include a first conductive electrode 1052 and a second conductive electrode 1056, a first conductivity type semiconductor layer 1053 on which the first conductive electrode 1052 is disposed, a second conductivity type semiconductor layer 1055 overlapping the first conductivity type semiconductor layer 1052 and on which the second conductive electrode 1056 is disposed, and an active layer 1054 disposed between the first and second conductivity type semiconductor layers 1053 and 1055.

Here, the first conductivity type can be a p-type, and the second conductivity type can be configured as an n-type, and vice versa. In addition, as described above, it can be a semiconductor light emitting device without the active layer.

Meanwhile, in the present invention, the first conductive electrode 1052 can be generated after the semiconductor light emitting device is assembled on the wiring substrate by self-assembly of the semiconductor light emitting device. Also, in the present invention, the second conductive electrode 1056 can include the magnetic material. The magnetic material can mean a magnetic metal. The magnetic material can be Ni, SmCo, or the like, and as another example, can include a material corresponding to at least one of Gd-based, La-based, or Mn-based materials.

The magnetic material can be provided on the second conductive electrode 1056 in the form of particles. Alternatively, in a conductive electrode including a magnetic material, one layer of the conductive electrode can be formed of a magnetic material. For this example, as shown in FIG. 9, the second conductive electrode 1056 of the semiconductor light emitting device 1050 can include a first layer 1056a and a second layer 1056b. Here, the first layer 1056a can include a magnetic material, and the second layer 1056b can include a metal material rather than a magnetic material.

As shown, in this example, the first layer 1056a including a magnetic material can be disposed to contact the second conductivity type semiconductor layer 1055. In this case, the first layer 1056a is disposed between the second layer 1056b and the second conductivity type semiconductor layer 1055. The second layer 1056b can be a contact metal connected to the second electrode of the wiring substrate. However, the present invention is not necessarily limited thereto, and the magnetic material can be disposed on one surface of the first conductivity type semiconductor layer.

Referring back to FIGS. 6 and 7, more specifically, the self-assembly device can include a magnet handler capable of automatically or manually moving the x, y, and z axes on the upper portion of the fluid chamber, or a motor capable of rotating the magnet 163. The magnet handler and the motor can constitute the position control unit 164. Through this, the magnet 163 rotates in a horizontal direction, clockwise or counterclockwise direction with the substrate 161.

Meanwhile, a light-transmitting bottom plate 166 can be formed in the fluid chamber 162, and the semiconductor light emitting devices can be disposed between the bottom plate 166 and the substrate 161. An image sensor 167 can be disposed to face the bottom plate 166 to monitor the inside of the fluid chamber 162 through the bottom plate 166. The image sensor 167 is controlled by the controller 172 and can include an inverted type lens and a CCD to observe the assembly surface of the substrate 161.

The self-assembly device described above can be made to use a combination of a magnetic field and an electric field. Using this, the semiconductor light emitting devices can be mounted at a pre-set position on the substrate by the electric field while the semiconductor light emitting devices are moved by a change in the position of the magnet. Hereinafter, the assembly process using the self-assembly device described above will be described in more detail.

First, a plurality of semiconductor light emitting devices 1050 including a magnetic material are formed through the process described with reference to FIGS. 5A to 5C. In this case, in the process of forming the second conductive electrode of FIG. 5C, a magnetic material can be deposited on the semiconductor light emitting device.

Next, the substrate 161 is transferred to the assembly position, and the semiconductor light emitting devices 1050 are put into the fluid chamber 162 (refer to FIG. 8A).

As described above, the assembly position of the substrate 161 can be a position in which the assembly surface of the substrate 161 on which the semiconductor light emitting devices 1050 are assembled faces downward in the fluid chamber 162.

In this case, some of the semiconductor light emitting devices 1050 can sink to the bottom of the fluid chamber 162 and some can float in the fluid. When the light-transmitting bottom plate 166 is provided in the fluid chamber 162, some of the semiconductor light emitting devices 1050 can sink to the bottom plate 166.

Next, a magnetic force is applied to the semiconductor light emitting devices 1050 so that the semiconductor light emitting devices 1050 vertically float in the fluid chamber 162 (FIG. 8B).

When the magnet 163 of the self-assembly device moves from its original position to the opposite surface of the assembly surface of the substrate 161, the semiconductor light emitting devices 1050 are raised in the fluid toward the substrate 161. The original position can be a position deviated from the fluid chamber 162. As another example, the magnet 163 can be configured as an electromagnet. In this case, electricity is supplied to the electromagnet to generate an initial magnetic force.

Meanwhile, in this example, if the magnitude of the magnetic force is adjusted, the separation distance between the assembly surface of the substrate 161 and the semiconductor light emitting devices 1050 can be controlled. For example, the separation distance is controlled using the weight, buoyancy, and magnetic force of the semiconductor light emitting devices 1050. The separation distance can be several millimeters to several tens of micrometers from the outermost surface of the substrate.

Next, a magnetic force is applied to the semiconductor light emitting devices 1050 so that the semiconductor light emitting devices 1050 move in one direction in the fluid chamber 162. For example, the magnet 163 moves in a direction parallel to the substrate, clockwise or counter-clockwise (refer to FIG. 8C). In this case, the semiconductor light emitting devices 1050 move in a direction parallel to the substrate 161 at a position spaced apart from the substrate 161 by the magnetic force.

Next, in the process of moving the semiconductor light emitting devices 1050, a step of inducing the semiconductor light emitting devices 1050 to the pre-set position by applying an electric field so as to be disposed at a pre-set position of the substrate 161 is performed (refer to FIG. 8C). For example, while the semiconductor light emitting devices 1050 are moving in a direction horizontal to the substrate 161, and move in a direction perpendicular to the substrate 161 by the electric field and are disposed at a pre-set position on the substrate 161.

More specifically, power is supplied to the bi-planar electrode of the substrate 161 to generate an electric field, and by using this, assembly is induced only at a pre-set position. That is, by using the selectively generated electric field, the semiconductor light emitting devices 1050 are self-assembled at the assembly position of the substrate 161. To this end, cells in which the semiconductor light emitting devices 1050 are inserted can be provided on the substrate 161.

Thereafter, the unloading process of the substrate 161 proceeds, and the assembly process is completed. When the substrate 161 is an assembly substrate, a post-process for realizing a display device by transferring the semiconductor light emitting devices arranged as described above to a wiring substrate can be performed.

Meanwhile, after guiding the semiconductor light emitting devices 1050 to the pre-set position, the magnet 163 can be moved in a direction away from the substrate 161 so that the semiconductor light emitting devices 1050 remaining in the fluid chamber 162 fall to the bottom of the fluid chamber (FIG. 8D). As another example, when power supply is stopped when the magnet 163 is an electromagnet, the semiconductor light emitting devices 1050 remaining in the fluid chamber 162 fall to the bottom of the fluid chamber 162.

Thereafter, when the semiconductor light emitting devices 1050 at the bottom of the fluid chamber 162 are recovered, the recovered semiconductor light emitting devices 1050 can be reused.

In order to increase assembly yield in fluidic assembly, the self-assembly device and method described uses a magnetic field to focus distant components near a pre-set assembly site, and applies a separate electric field to the assembly site to selectively assemble components only at the assembly site. At this time, the assembly substrate is placed on the upper part of the water tank and the assembly surface is directed downward to minimize the effect of gravity due to the weight of the parts and prevent non-specific binding to eliminate defects. That is, to increase the transfer yield, the assembly substrate is placed on the upper part to minimize the influence of gravity or frictional force, and non-specific binding is prevented.

As described above, according to the present invention having the above configuration, in a display device in which individual pixels are formed of semiconductor light emitting devices, a large number of semiconductor light emitting devices can be assembled at once.

As described above, according to the present invention, it is possible to pixelate a large amount of semiconductor light emitting devices on a small-sized wafer and then transfer them to a large-area substrate. Through this, it is possible to manufacture a large-area display device at a low cost.

Hereinafter, a display device using a semiconductor light emitting device of a new structure according to an embodiment of the present invention will be described with reference to the accompanying drawings.

The display device 1000 according to an embodiment of the present invention is a structure for self-assembling semiconductor light emitting devices, and is an active matrix type (hereinafter, AM type) display device to which an assembly electrode 1020 is added.

First, the structure of the conventional AM display device will be briefly described. FIGS. 10 and 11 are conceptual diagrams illustrating the structure and circuit of a pixel portion in a conventional AM display device.

In the AM display device 200, a gate line 201 and a data line 202 can be disposed on a base substrate. As shown in FIG. 10, the gate line 201 and the data line 202 can extend in different directions to cross each other, thereby defining a pixel area.

In the pixel region, including the semiconductor light emitting device 230, thin film transistors 210s and 210d for driving the semiconductor light emitting device 230 and the storage capacitor 220 can be disposed. In addition, a connection electrode 240 for electrically connecting them can be further provided.

In addition, wirings Vss and Vdd for supplying power other than the gate wiring 201 and the data wiring 202 can be further disposed on the base substrate. The arrangement and design of the wiring can be variously changed.

Meanwhile, the thin film transistor 210 includes a gate electrode, an active layer, a source electrode, and a drain electrode, and is divided into an a-Si type and LTPS type in which the active layer is formed of silicon, and an oxide type in which the active layer is formed of silicon according to the material of the active layer. Among them, the oxide type is used for large displays used in PC and TV.

Specifically, in the oxide type (hereinafter, oxide thin film transistor or oxide TFT), the active layer is formed of an IGZO (Indium, Gallium, Zinc, Oxygen) combination. IGZO bonding materials are suitable for large display applications due to their high processing speed and low cost.

However, since the oxide thin film transistor has very weak characteristics, there is a problem in that the performance cannot be maintained and degraded according to a subsequent process performed after the oxide thin film transistor is manufactured on a substrate.

Accordingly, a structure for assembling the semiconductor light emitting device 240 having a size of several to several tens of μm by a self-assembly method in the display device 200 of the AM method, for example, assembly electrodes to which a voltage for forming an electric field is applied to one surface of a substrate, can be limited.

In the past, in order to assemble the semiconductor light emitting device 240 having a size of several to several tens of μm in the display device 200 of the AM method, after assembling the semiconductor light emitting devices 240 through self-assembly on the donor substrate on which the assembly electrode is formed, a method of transferring the semiconductor light emitting devices 240 from the assembly substrate to the final substrate 200 on which the thin film transistors 210 and wirings 201 and 202 are formed using the PDMS stamp was used.

An object of the present invention is to provide an active matrix type display device 1000 to which an assembly electrode 1020 for self-assembly is added.

FIG. 12 is a view showing the structure of a pixel portion in an AM type display device according to an embodiment of the present invention and FIG. 15 is a diagram illustrating a side cross-section of a pixel portion in an AM display device according to an embodiment of the present invention.

Referring to FIG. 12, the display device 1000 according to an embodiment of the present invention can include a plurality of gate wires 1001 and data wires 1002, an assembly electrode 1020, a thin film transistor 1030, a storage capacitor 1040, and a semiconductor light emitting device 1050 on a base part 1010.

The base part 1010 can include polyimide (PI, polyimide) in order to implement flexible performance, and in addition to insulating and flexible material, it is not particularly limited.

The gate line 1001 and the data line 1002 are formed to cross each other, and can be connected to the thin film transistor 1030. Also, a pixel region can be defined by the gate line 1001 and the data line 1002.

The pixel region can be a region on the base part 1010, and can be a region in which the semiconductor light emitting device 1050' and the thin film transistor 1030 are disposed.

Also, the semiconductor light emitting device 1050' and the thin film transistor 1030 can be disposed in different regions within the pixel region. According to this embodiment, the semiconductor light emitting device 1050' is disposed on a first region of the base part 1010, and the thin film transistor 1030 is disposed on a second region of the base part 1010, and the first region and the second region can be regions within the pixel region.

That is, in FIG. 15, the region in which the semiconductor light emitting device 1040 is disposed can be the first region, and the region in which the thin film transistor 1030 is disposed can be the second region.

Meanwhile, the storage capacitor 1040 can be disposed on the second region together with the thin film transistor 1030.

In an embodiment of the present invention, the semiconductor light emitting device 1050' can be a flip chip type in which a p-type electrode 1052' and an n-type electrode 1056' are formed on one side of the semiconductor light emitting device 1050'. However, the present invention is not necessarily limited thereto, and a structure in which the positions of the p-type electrode and the n-type electrode are changed can be used, and a semiconductor light emitting device having a vertical structure can be used.

The thin film transistor 1030 can be divided into a switching thin film transistor 1030s and a driving thin film transistor 1030d according to roles. One semiconductor light emitting device 1050' can be simultaneously connected to the switching thin film transistor 1030s and the driving thin film transistor 1030d. Meanwhile, the structures and manufacturing processes of the switching thin film transistor 1030s and the driving thin film transistor 1030d are the same.

The thin film transistor 1030 can include a gate electrode G, a source electrode S, a drain electrode D, and a (gate) insulating layer GI.

Hereinafter, the structure of the thin film transistor 1030 will be briefly described.

First, the gate electrode G can be formed of a metal material such as molybdenum (Mo), and can be formed by depositing a gate conductive layer on the base part 1010 and forming a photoresist pattern, and then selectively patterning the gate conductive layer using the photoresist pattern as a mask.

A (gate) insulating layer GI can be formed on the gate electrode G. For example, the insulating layer GI can be formed by depositing a silicon oxide or silicon nitride material on the base part 1010 to cover the gate electrode G.

An active layer A can be formed on the insulating layer GI. The active layer A can be deposited on the insulating layer GI to overlap a portion of the gate electrode G, and can be insulated from the gate electrode G by the insulating layer GI.

In an embodiment of the present invention, the active layer (A) can be formed of anisotropic IGZO. That is, the thin film transistor 1030 according to the present embodiment can be an oxide thin film transistor.

On both sides of the active layer (A), the source electrode (S) and the drain electrode (D) can be formed to be spaced apart from each other. The source electrode S and the drain electrode D can also be formed of a metal material such as molybdenum (Mo).

A first passivation layer 1070 can be formed on the insulating layer GI. The first passivation layer 1070 can be stacked on the insulating layer GI while forming holes H1 and H2 exposing portions of the source electrode S and the drain electrode D. In addition, the first passivation layer 1070 can be formed of an inorganic insulating material such as silicon oxide or silicon nitride, and can have a single-layer or multi-layer structure having a thickness of several tens to several hundred nm.

Meanwhile, the semiconductor light emitting device 1050' and the thin film transistor 1030 can be electrically connected through the connection electrode 1060. Specifically, the connection electrode 1060 is formed to extend from the first region to the second region, and can simultaneously cover any one of the holes H1 and H2 exposing a portion of the source electrode S and the drain electrode D, and any one of the electrodes 1052' and 1056' of the semiconductor light emitting device.

That is, through the connection electrode 1060, the p-type electrode 1052' and the n-type electrode 1056' of the semiconductor light emitting device can be connected to any one of the source electrode S and the drain electrode D of the thin film transistor 1030, respectively.

According to an embodiment of the present invention, the display apparatus 1000 can further include an assembly electrode 1020 for self-assembly. A voltage can be applied to the assembly electrode 1020 to assemble the semiconductor light emitting device 1050' at a pre-set position on the first region.

FIGS. 16(a) and 16(b) are diagrams illustrating side cross-sections of an area (AA' in FIG. 12) in which data wires and assembly electrodes are formed in an AM display device according to an embodiment of the present invention.

Referring to FIG. 16, the assembly electrode 1020 can be formed to extend along one direction on the base part 1010 and can extend in the same direction as the data line 1002. That is, the data line 1002 and the assembly electrode 1020 can be disposed parallel to each other with a layer made of an insulating material therebetween in the structure of the substrate, and can overlap each other. In this case, the data line 1002 and the assembly electrode 1020 can be spaced apart from each other with the first passivation layer 1070 interposed therebetween as shown in FIG. 16A.

Meanwhile, a parasitic capacitance can be made between the data line 1002 and the assembly electrode 1020 arranged in parallel to generate a distorted signal, and furthermore, the distorted signal can generate a leakage current from the thin film transistor 1030 and cause pixel defects.

To prevent this, according to an embodiment of the present invention, a second passivation layer 1080 can be further included between the data line 1002 and the assembly electrode 1020 as shown in FIG. 16(b).

The second passivation layer 1080 can be formed on at least an area overlapping with the data line 1002 and the assembly electrode 1020 among the entire area of the first passivation layer 1070. That is, the second passivation layer 1080 can reduce the parasitic capacitance by increasing the separation distance between the data line 1002 and the assembly electrode 1020.

The second passivation layer 1080 can be formed to have a thickness greater than that of the first passivation layer 1070, for example, can be formed to a thickness of several μm.

Also, the second passivation layer 1080 can be formed of an insulating material, preferably a photosensitive organic insulating material. When the inorganic material is deposited to a thickness of several μm (e.g., PECVD), deposition takes a long time, and plasma generated at a high temperature of 300° C. or higher may adversely affect the thin film transistor 1030.

Accordingly, according to an embodiment of the present invention, the second passivation layer 1080 can be formed of an organic insulating material, thereby shortening a process time, minimizing an effect on the thin film transistor 1030, and furthermore, the second passivation layer 1080 has an advantage in that it is easy to etch.

According to an embodiment of the present invention, the assembly electrodes 1020 can be formed so as not to overlap the thin film transistor 1030 as shown in FIG. 12.

In addition, the assembly electrodes 1020 can further include a first protrusion 1021 protruding toward the semiconductor light emitting device 1050' in the first region, and the first protrusion 1021 can overlap the semiconductor light emitting device 1050' seated at a pre-set position on the substrate.

In detail, assembly electrodes 1020 can form a pair electrode between adjacent assembly electrodes 1020, and the semiconductor light emitting device 1050' can overlap with the first protrusion 1021 of the assembly electrodes 1020 forming the pair electrode at the same time.

FIGS. 13(a) to 13(c) are views showing the shapes of various assembly electrodes for performance comparison of thin film transistors.

FIG. 13 (a) shows a structure (case 1) in which the assembly electrode 1020 and the thin film transistor 1030 completely overlap. FIG. 13(b) shows a structure (case 2) in which the assembly electrode 1020 and the thin film transistor 1030 partially overlap. FIG. 13(c) shows a structure (case 3) in which the assembly electrode 1020 and the thin film transistor 1030 do not overlap as in the embodiment of the present invention.

Table 1 below shows the results showing the performance of the thin film transistor 1030 and the self-assembly rate of the semiconductor light emitting device 1050' after self-assembly under the structures shown in FIGS. 13(a) to (c).

TABLE 1

| | case1 | case2 | case3 |
|---|---|---|---|
| Thin Film Transistor Performance | completely inoperable | degraded or inoperable | no problem |
| self-assembly rate | 99.99% or more | 99.9% or more | 99.9% or more |

According to [Table 1], in case 1, although the width direction thickness of the assembly electrode 1020 is sufficient, there is no voltage drop phenomenon due to resistance and the assembly yield is excellent, the electric field formed by the voltage applied to the assembly electrode 1020 has a problem of damaging both the assembly electrode 1020 and the overlapping thin film transistors 1030s and 1030d. In case 2, the thin film transistor 1030 was completely damaged or deteriorated in function depending on the degree of overlap with the assembly electrode 1020, and as the widthwise thickness of the assembly electrode 1020 became narrow, the assembly yield was also lower than in case 1.

On the other hand, according to the structure according to the embodiment of the present invention as in case 3, since the assembly electrode 1020 is formed not to overlap the thin film transistor 1030, the performance of the thin film transistor 1030 is maintained even after self-assembly.

However, as the width direction thickness of the assembly electrode 1020 decreased, the resistance of the assembly electrode 1020 increased, so that the assembly yield was lower than that of case 1. However, the problem of increasing the resistance of the assembly electrode 1020 can be partially improved by using a metal having a low resistance value as the assembly electrode 1020.

Meanwhile, in order to improve the self-assembly yield of the semiconductor light emitting device 1050' under the structure of the display device 1000 according to the embodiment of the present invention, the assembly electrode 1020 can further include at least one of the second protrusion 1022 and the third protrusion 1023.

The second protrusion 1022 can protrude toward the second region where the thin film transistor 1030 is disposed, and the third protrusion 1023 can protrude toward the first region in which the semiconductor light emitting device 1050' is disposed and the second region in which the thin film transistor 1030 is disposed. In this case, the third protrusion 1023 cannot overlap the thin film transistor 1030.

Since the assembly electrode 1020 includes protrusions (particularly, the second and third protrusions), it is possible to prevent an increase in resistance by supplementing the thin width direction of the assembly electrode 1020.

FIG. 14 is a diagram showing the structure of a pixel portion in an AM display device according to another embodiment of the present invention.

Referring to FIG. 14, each of the assembly electrodes 1020a and 1020b forming the pair electrode can have different shapes. That is, any one of the assembly electrodes 1020 (hereinafter, the first assembly electrode) 1020a forming the pair electrode can include a first protrusion 1021 and a second protrusion 1022, the other (hereinafter, second assembly electrode) 1020b can include a first protrusion 1021 and a third protrusion 1023.

Meanwhile, each of the assembly electrodes 1020a and 1020b forming the pair electrode is not limited to the structure shown in FIG. 14 and can have various structures. However, it is preferable to satisfy the condition of [Equation 1] below.

$$|A-B|/A \leq 0.1 \text{ and } |A-B|/B \leq 0.1 \qquad \text{[Equation 1]}$$

(A: area of the protrusion of the first assembly electrode, B: area of the protrusion of the second assembly electrode)

That is, the first assembly electrode 1020a and the second assembly electrode 1020b forming the pair electrode can have different shapes, but the areas of the protrusions included in the first assembly electrode 1020a and the second assembly electrode 1020b can be the same or similar.

When the difference between the protrusion areas of the first assembly electrode 1020a and the second assembly electrode 1020b is out of the range of [Equation 1], the assembly rate deviation according to the resistance difference between the first assembly electrode 1020a and the second assembly electrode 1020b may occur.

As described above, the display apparatus 1000 according to an embodiment of the present invention can include a structure for self-assembly and has the effect of directly assembling the semiconductor light emitting devices 1050' on the AM type display substrate 1000 including the thin film transistor 1030 through self-assembly.

In particular, by forming the assembly electrode 1020 so as not to overlap the thin film transistor 1030, the performance degradation of the thin film transistor 1030 due to self-assembly can be prevented, and the performance of the thin film transistor 1030 can be improved even after self-assembly.

In addition, by manufacturing various shapes of the assembly electrode 1020 under a condition that does not overlap with the thin film transistor 1030, the resistance increase of the assembly electrode 1020 can be prevented, and an assembly rate of a certain level or higher can be secured.

The above-described present invention is not limited to the configuration and method of the above-described embodiments, but the embodiments can be configured by selectively combining all or part of each embodiment so that various modifications can be made.

The invention claimed is:

1. A display device comprising:
   a base part;
   a semiconductor light emitting device disposed on a first region of the base part; and
   a plurality of assembly electrodes extending along one direction on the base part and to which a voltage is applied to dispose the semiconductor light emitting device at a pre-set position on the first region,
   wherein the plurality of assembly electrodes are disposed not to overlap a thin film transistor,
   wherein the plurality of assembly electrodes comprise a first protrusion protruding from the first region toward the semiconductor light emitting device, the first protrusion overlapping the semiconductor light emitting device,
   wherein the plurality of assembly electrodes further comprise at least one of a second protrusion protruding toward a second region and a third protrusion toward the first region and the second region,
   wherein the display device further comprises a storage capacitor disposed in the second region, and
   wherein the storage capacitor is disposed between the second protrusion and the third protrusion.

2. The display device according to claim 1, wherein a pair electrode is formed by adjacent assembly electrodes among the plurality of assembly electrodes, and
   wherein each of the plurality of assembly electrodes forming the pair electrode has a different shape.

3. The display device according to claim 2, wherein an area A of the first protrusion and an area B of the second protrusion of each of the plurality of assembly electrodes forming the pair electrode satisfy Equation 1 below:

$$|A-B|/A \leq 0.1 \text{ and } |A-B|/B \leq 0.1 \qquad \text{[Equation 1]}$$

4. The display device according to claim 1, wherein the thin film transistor is an oxide thin film transistor.

5. The display device according to claim 4, wherein the thin film transistor comprises a gate electrode;
   an active layer insulated from the gate electrode by an insulating layer and overlapping a portion of the gate electrode; and
   a source electrode, and a drain electrode respectively formed on opposite sides of the active layer.

6. The display device according to claim 5, further comprising a first passivation layer formed on the insulating layer while forming holes exposing portions of the source electrode and the drain electrode, respectively.

7. The display device according to claim 6, further comprising a connection electrode extending from the first region to the second region to cover as least one of the holes and at least one conductive electrode among conductive electrodes of the semiconductor light emitting device and electrically connecting the thin film transistor and the semiconductor light emitting device.

8. The display device according to claim 6, further comprising a second passivation layer formed on a region overlapping at least a data line and the plurality of assembly electrodes among an entire region of the first passivation layer.

9. The display device according to claim 8, wherein the second passivation layer is formed of an organic material, and has a thickness greater than a thickness of the first passivation layer.

10. The display device according to claim 1, wherein the first protrusion comprises a plurality of first protrusions, and the semiconductor light emitting device overlaps the plurality of first protrusions.

11. The display device according to claim 1, wherein the third protrusion does not overlap the thin film transistor.

12. The display device according to claim 1, wherein the second protrusion partially overlaps the thin film transistor.

13. The display device according to claim 1, wherein the second protrusion and the third protrusion are spaced apart from each other.

14. The display device according to claim 1, wherein the thin film transistor is disposed between the first protrusion and the second protrusion.

15. The display device according to claim 7, wherein the connection electrode covers both of any one of the holes and any one of the conductive electrodes of the semiconductor light emitting device.

16. The display device according to claim 8, wherein the data line and the plurality of assembly electrodes are disposed in parallel with the second passivation layer interposed there between, and overlap each other.

17. The display device according to claim 1, wherein the storage capacitor overlaps the second protrusion and does not overlap the third protrusion.

\* \* \* \* \*